(12) United States Patent
Straßer

(10) Patent No.: US 12,733,550 B2
(45) Date of Patent: Sep. 8, 2026

(54) POWER ELECTRONICS ARRANGEMENT WITH PARALLEL CONNECTED SEMICONDUCTOR SWITCHES, POWER ELECTRONICS DEVICE, MOTOR VEHICLE, AND METHOD FOR PRODUCING A POWER ELECTRONICS ARRANGEMENT

(71) Applicant: AUDI AG, Ingolstadt (DE)

(72) Inventor: Roman Straßer, Gaimersheim (DE)

(73) Assignee: AUDI AG, Ingolstadt (DE)

( * ) Notice: Subject to any disclaimer, the term of this patent is extended or adjusted under 35 U.S.C. 154(b) by 434 days.

(21) Appl. No.: 18/322,459

(22) Filed: May 23, 2023

(65) Prior Publication Data

US 2023/0387099 A1 Nov. 30, 2023

(30) Foreign Application Priority Data

May 25, 2022 (DE) ......................... 102022113195.5

(51) Int. Cl.

*H10W 90/00* (2026.01)
*H10W 70/60* (2026.01)
*H10W 70/65* (2026.01)
*H10W 72/00* (2026.01)
*H10W 72/50* (2026.01)

(52) U.S. Cl.

CPC .......... *H10W 90/00* (2026.01); *H10W 70/611* (2026.01); *H10W 70/65* (2026.01); *H10W 72/07552* (2026.01); *H10W 72/07555* (2026.01); *H10W 72/527* (2026.01); *H10W 72/5524* (2026.01); *H10W 72/5525* (2026.01); *H10W 72/557* (2026.01); *H10W 90/753* (2026.01)

(58) Field of Classification Search

CPC ..... H01L 25/18; H01L 23/5386; H01L 24/45; H01L 24/48; H01L 24/49; H01L 2224/45124; H01L 2224/45147; H01L 2224/48137; H01L 2224/4903; H01L 2224/49505; H01L 2924/10272; H01L 2924/13091; H01L 25/072; H03K 17/122; H03K 17/127; H03K 17/28; H03K 17/081; H03K 17/14; H02M 1/0003

See application file for complete search history.

(56) References Cited

U.S. PATENT DOCUMENTS 5,767,579 A 6/1998 Kanazawa et al.
2012/0268476 A1 10/2012 Park (Continued)

FOREIGN PATENT DOCUMENTS

DE 69626371 T2 2/2004
DE 102008040480 A1 1/2010
DE 102016002191 A1 8/2017

(Continued)

*Primary Examiner* — Elias Ullah

(74) *Attorney, Agent, or Firm* — Seed Intellectual Property Law Group LLP

(57) ABSTRACT

A power electronics arrangement, comprising an electrical conduction section, and a switching device which, in operation, switches the electrical conduction section. The switching device includes multiple parallel connected semiconductor switches which are triggered in common by a plurality of lead wires from a control unit and are switched across respective ones of the lead wire upon reaching a switching state of charge. Each of the lead wires has a same electrical resistance, and a different length.

13 Claims, 2 Drawing Sheets

(56) References Cited

U.S. PATENT DOCUMENTS

| | | | | |
|---|---|---|---|---|
| 2013/0278570 | A1 | 10/2013 | Park et al. | |
| 2015/0069463 | A1* | 3/2015 | Hartmann | H01L 25/072 257/139 |

FOREIGN PATENT DOCUMENTS

| | | | |
|---|---|---|---|
| DE | 102014117385 | B4 | 12/2021 |
| EP | 0780899 | A2 | 6/1997 |
| EP | 2146375 | A1 | 1/2010 |
| KR | 20050003261 | A | 1/2005 |
| WO | 2013/093410 | A1 | 6/2013 |
| WO | 2015/001311 | A1 | 1/2015 |

* cited by examiner

POWER ELECTRONICS ARRANGEMENT WITH PARALLEL CONNECTED SEMICONDUCTOR SWITCHES, POWER ELECTRONICS DEVICE, MOTOR VEHICLE, AND METHOD FOR PRODUCING A POWER ELECTRONICS ARRANGEMENT

BACKGROUND

Technical Field

The disclosure relates to a power electronics arrangement, comprising a switching device for the switching of an electrical conduction section of the electronics arrangement, wherein the switching device comprises multiple parallel connected semiconductor switches which are triggered in common by a control unit through lead wires and are switched across the respective lead wire upon reaching a switching state of charge. In addition, the disclosure relates to a power electronics device, a motor vehicle and a method for producing a power electronics arrangement.

Description of the Related Art

Semiconductor switches are often used in power electronics applications, such as in motor vehicles, in order to main conduction sections conducting or blocking, or in some instances also to provide definite resistances along the conduction section. Semiconductor switches for power electronics are usually suitable for certain maximum currents. Therefore, it has been proposed to hook up multiple parallel connected semiconductor switches in order to also handle heavier currents. The multiple parallel connected semiconductor switches then act like a single, large switch. Semiconductor switches (often also known as power semiconductors) can be used for example in power electronics devices such as pulse inverters, charging devices, DC voltage converters or the like.

Manufacturing techniques have become known for IGBTs (IGBT=Insulated Gate Bipolar Transistor), also known as Si-switches, making it possible to produce large switches with high current carrying ability, so that in many cases one or a few IGBTs, such as two of them, are already sufficient. In particular, it is possible to obtain very large chips from wafers.

In current development, however, MOSFETs (MOSFET=Metal Oxide Semiconductor Field Effect Transistor), especially those based on SiC, are becoming important. However, the defect rate on the wafer is still relatively high with current manufacturing methods, so that only small chips and hence small semiconductor switches can be made, being designed for low maximum currents. Therefore, when switching devices need to be provided for high currents, often large numbers of MOSFETs are hooked up in parallel as semiconductor switches, for example four, six, or eight MOSFETs.

Since the semiconductor switches of the switching device are supposed to be triggered in common, a lead wire from a control unit to the semiconductor switch is required for each of the semiconductor switches, especially in regard to the gate terminal, and the corresponding switching signals are applied by the control unit, usually by applying a voltage, to the different lead wires at the same time. However, it may happen, given the different lengths of the lead wires, especially with an increasing number of semiconductor switches, that different switching time points will result for the individual semiconductor switches. Semiconductor switches are usually switched in dependence on a particular gate-source voltage, which is produced by charging a corresponding capacitance through the gate terminal of the semiconductor switch, and therefore a given switching state of charge must be achieved. For different geometrical positions and thus different resulting lengths of the lead wires, it takes a different time (switching time) until the switching state of charge is reached, in an otherwise identical configuration of the lead wires, for example, as ordinary bond wires. Semiconductor switches with the shortest lead wires are the first to be switched and are therefore loaded initially with the full total current through the conduction section until further semiconductor switches are also added. As a result, either the semiconductor switches need to be overdimensioned, in order to handle this load, of the service life of the semiconductor switches and thus of the switching device will be shortened.

DE 10 2014 117 385 A1 relates to a power semiconductor circuit having current valves electrically connected in parallel with each other and a trigger circuit which is adapted for the triggering of the current valves electrically connected in parallel with each other. Trigger signals are generated by the trigger circuit such that, when the current valves electrically connected in parallel with each other are switched off, a current valve of the current valves electrically connected in parallel having a longer switch-off time period than the switch-off time period of the other current valves electrically connected in parallel or, if the power semiconductor circuit has two current valves electrically connected in parallel, a longer a longer switch-off time period than the switch-off time period of the other current valve electrically connected in parallel. This should achieve benefits in regard to reducing the voltages and stray inductances. It is assumed that differences in the switch-off behavior of the current valves due to different line lengths can be disregarded.

WO 2013/0093410 relates to a control unit for controlling a power semiconductor switching device in one of a plurality of states. Interim states are also proposed here, in which a particular resistance of the switching device occurs, in order to switch hundreds of power semiconductor switching devices in a synchronized, controlled manner. A feedback control circuit is used, employing negative feedback, so that the behavior of the switching device can be controlled, based on measured voltage and current feedback signals, so that the switching device behaves like a passive resistance. The effective resistance of the switching device can be adapted by adapting the parameters of the feedback control loop.

WO 2015/001311 A1 relates to methods and circuitry for control of the switching processes of parallel coupled power semiconductor switching devices, for example in a power converter. It is proposed there to introduce switching delays for the different switching devices relative to corresponding command signals, in order to reduce the variance between the switching delays of the plurality of switching devices and/or to reduce the variation of the switching delays of a switching device over time.

BRIEF SUMMARY

Embodiments of the disclosure provide an improved possibility of synchronization of the switching on behavior of power semiconductor switches in a parallel layout, especially one which accomplishes this without a massive increase in the control expense.

According to the disclosure, in a power electronics arrangement of the kind mentioned above, all lead wires have at least basically the same electrical resistance, despite having different lengths at least partially.

The disclosure is thus based on the knowledge that the major factor resulting in different switching time points for different lengths of the (otherwise identical) lead wires is the different ohmic resistance resulting from the different lengths, which can delay the reaching of the switching state of charge, and therefore in particular a switching voltage in a capacitive layout. It is therefore proposed to adapt the resistance of the lead wires (trigger lines) in accordance with the geometrical length, so that the same ohmic resistance is present for all lead wires and thus at least basically identical switching time points can be realized. In this way, the switching on behavior of the semiconductor switches can thus be synchronized and an overloading of individual semiconductor switches can be avoided. Over dimensioning of the power semiconductor switches is no longer necessary, so that costs and design space can be saved. At the same time, the power electronics arrangement becomes more robust, and thus the quality and the service life of a power electronics device utilizing the power electronics arrangement are also improved.

The lead wires connect trigger outputs of the control unit, such as a control chip, to the gate terminals of the particular power semiconductor switches. The semiconductor switches can basically be IGBTs, but the procedure according to the disclosure is especially advantageous for use with MOSFETs, especially SiC-MOSFETs, so that the semiconductor switches can preferably be MOSFETs. The power electronics arrangement can comprise, for example, three to ten semiconductor switches, but it is also possible to use more than ten semiconductor switches, for example up to fifty, up to a hundred, or even up to a thousand semiconductor switches. The lead wires can advisedly comprise bond wires and/or conductor tracks on a circuit board carrying the semiconductor switches. A configuration as bond wires, at least in part, is especially preferable, since properties influencing the resistance can be adapted in an especially simple manner for them.

If the semiconductor switches are designed as chips, which is customary, the control unit also known as the trigger component can likewise be designed as a chip, and the corresponding terminals of the chips, i.e., control terminals of the control unit, can be connected by bond wires to the gate terminals of the semiconductor switches.

Specifically, it can be provided, for the equalizing of resistance differences due to the length of the lead wires, that lead wires of different length differ in at least one adaptation property, besides the length, in order to equalize the resistance differences due to the length of the lead wires. It has proven to be advisable here for the adaptation property to be the material from which the lead wires are made, and/or the lateral extension, especially the thickness, of the lead wires. In other words, the thickness of the lead wire, such as its diameter or edge length, can be varied in order to reduce the resistance which has been increased on account of the length. Regarding the material, it can be provided that the different materials differ in their purity and/or in their electrical conductance and/or in their composition, especially in the case of alloys. Therefore, the material can also be varied, especially in regard to its purity, the electrical conductance, and/or the alloyage, in order to equalize resistance differences occurring due to different lengths and to provide lead wires with the same resistance.

For example, one can start with a basic material, especially copper or aluminum. It can then be provided that the longest lead wires consist of the pure basic material, while the purity diminishes with length for shorter conductors. The pure material has the highest conductivity, whereas this decreases with decreasing purity and the resistance decrease is compensated by virtue of the length.

Besides the power electronics arrangement, the disclosure also relates to a power electronics device having at least one power electronics arrangement according to the disclosure. The remarks given in regard to the power electronics arrangement also hold for the power electronics device. The power electronics device can be, for example, a converter device, especially a pulse inverter and/or a DC voltage converter, or a charging device for a high-voltage battery to be installed in a motor vehicle.

A motor vehicle according to the disclosure comprises at least one power electronics device according to the disclosure. In particular, the motor vehicle can be an electric vehicle or a hybrid vehicle, which therefore comprises an electric machine, which is connected to a high-voltage network, the voltage of which is higher than the voltage of a low-voltage network of the motor vehicle. The power electronics device can then be a converter, for example, by which the electric machine is connected to the high-voltage network, or it can also be a power electronics device otherwise connected to the high-voltage network, such as a DC voltage converter connecting the high-voltage network to the low-voltage network.

Finally, the disclosure also relates to a method for producing a power electronics arrangement, comprising a switching device for the switching of an electrical conduction section of the power electronics arrangement, wherein the switching device comprises multiple parallel connected semiconductor switches which are triggered in common by a control unit through lead wires and are switched across the respective lead wire upon reaching a switching state of charge. The method is characterized in that lead wires of different length are adapted by selection of at least one adaptation property so that the electrical resistances of the lead wires are at least basically the same. Hence, a power electronics arrangement according to the disclosure can be produced with the method. In general, adaptation properties different from the length will be varied in order to equalize the resistances of the lead wires as much as possible to each other and thereby achieve the most exact possible synchronization of the switching time points of the semiconductor switches.

Specifically, mounting devices can be used for example to carry out the method, which can mount different kinds of conductor with a single mounting head. Such mounting devices, such as those for pick and place methods, have already been proposed.

Of course, the remarks made for the preceding subjects of the disclosure also apply to the method.

BRIEF DESCRIPTION OF THE SEVERAL VIEWS OF THE DRAWINGS

Further benefits and details of the present disclosure will emerge from the exemplary embodiments described in the following with the aid of the drawing.

DETAILED DESCRIPTION

Figure 1:
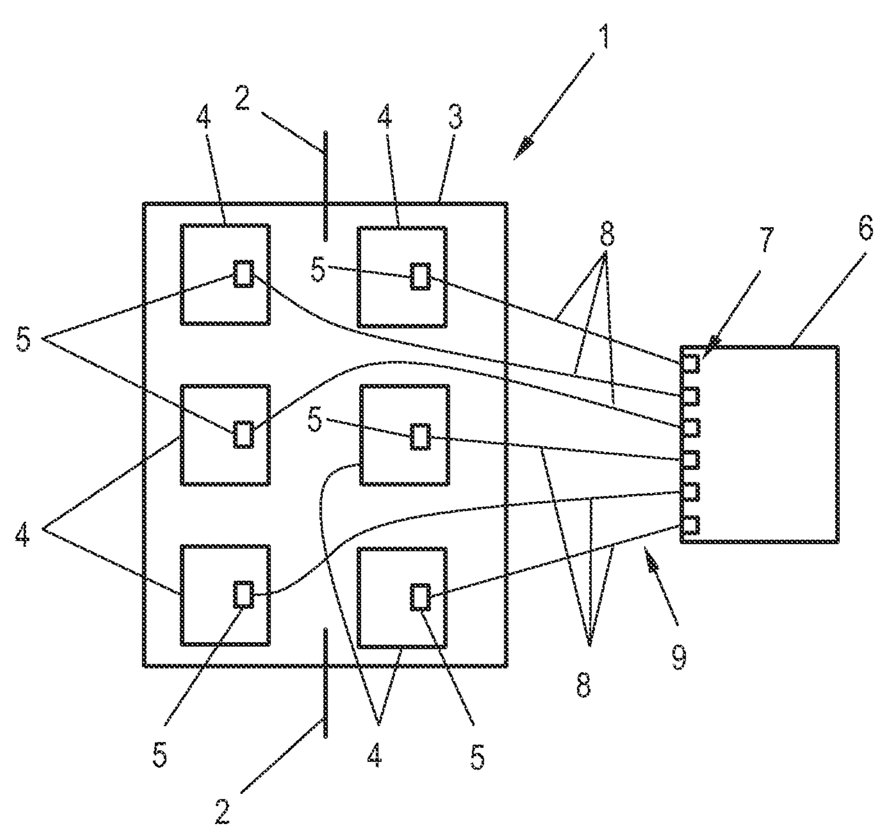
FIG. 1 shows a schematic sketch of a power electronics arrangement according to the disclosure.

FIG. 1 shows a schematic diagram of a power electronics arrangement 1 according to the disclosure having a conductor section 2 which is to be switched by way of a switching device 3. Because the current flowing through the conductor section 2 potentially exceeds the maximum permissible currents for certain of the power semiconductor switches used here, being in the present case SiC-MOSFETs, the switching device 3 has a plurality of such semiconductor switches 4, such as six, all of them being hooked up in parallel. For sake of a more simple representation, the semiconductor switches 4 are only indicated here schematically by their corresponding chips. Besides the terminals not otherwise shown here for the corresponding branched conduction section 2, i.e., the source terminal and the drain terminal, each of the semiconductor switches 4 realized as chips has a gate terminal 5 as its triggering terminal.

Figure 2:
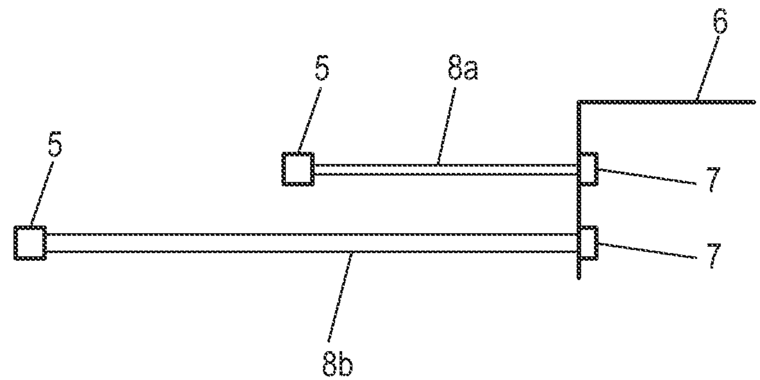
FIG. 2 shows a first possible configuration of lead wires.

These semiconductor switches 4 are to be triggered by a control unit 6, which in the present case is also designed as a chip, in such a way that they behave like one large switch, for which corresponding triggering terminals 7 of the control unit 6 are connected by lead wires 8, configured here as bond wires 9, to a respective gate terminal 5 of the semiconductor switches 4. Because of the geometrical arrangement of the semiconductor switches 4, the lead wires 8 will have different lengths. Nevertheless, by virtue of the appropriate choice of adaptation properties other than the length, it is assured in the power electronics arrangement of FIG. 1 that the lead wires 8 all have the same resistance, since then the most exact possible switching of the semiconductor switches 4 on and off is possible while at the same time generating the triggering signals by the control unit 6. FIG. 2 shows a first possibility for such an adapting. Here, two lead wires 8*a*, 8*b* are shown, each time between a gate terminal 5 and a trigger terminal 7 of the control unit 6. As can be seen, the lead wire 8*b* is longer than the lead wire 8*a*. The resistance increase resulting from this, for the identical configuration of the lead wires 8*a*, 8*b*, is equalized in the example of FIG. 2 in that the diameter, and hence the thickness of the lead wire 8*b* is increased relative to that of the lead wire 8*a*, so that the lead wires 8*a*, 8*b* nevertheless have the same ohmic resistance.

Figure 3:
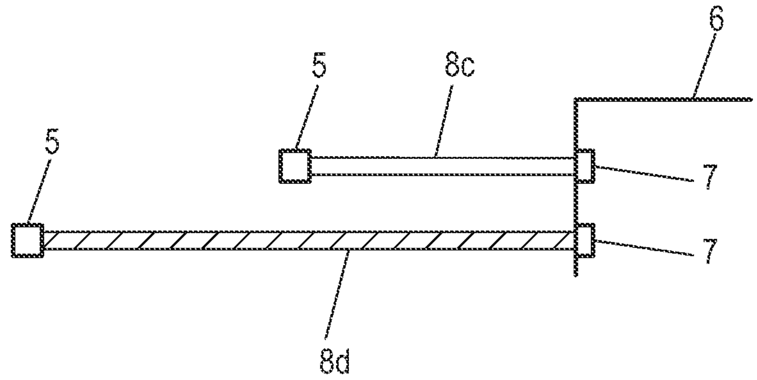
FIG. 3 shows a second possible configuration of lead wires.

Another possibility is illustrated schematically by FIG. 3. Here, once again, two lead wires 8*c*, 8*d* of different length are shown. However, the adaptation property here is the material from which the lead wires 8*c*, 8*d* are made. In the present case, the material of the lead wire 8*d*, shown hatched in order to distinguish it, has a higher electrical conductivity than the material of the lead wire 8*c*, so that the length difference is at least basically compensated. Various material differences are conceivable, for example differences in purity, in alloyage, or also in the basic material.

Figure 4:
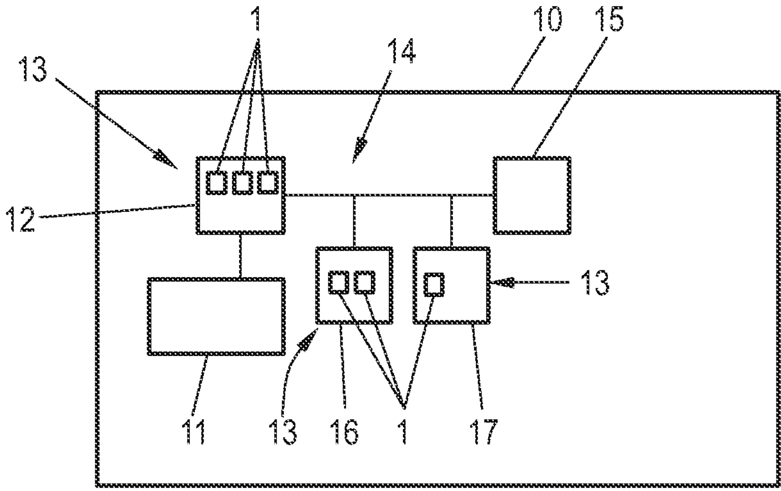
FIG. 4 shows a schematic sketch of a motor vehicle according to the disclosure.

FIG. 4 finally shows a schematic sketch of a motor vehicle 10 according to the disclosure. In the present case, this involves an electric vehicle, having an electric machine 11 in a not otherwise illustrated drive train. The electric machine 11 is connected across an inverter 12 as the power electronics component 13 to a high-voltage network 14, which is powered by a battery 15. Further power electronics devices 13 shown on the high-voltage network 14 are, for example, a DC voltage converter 16 and an onboard charger 17 for the battery 15. In the present case, all these power electronics devices 13 have at least one power electronics arrangement 1 according to the disclosure.

German patent application no. 102022113195.5, filed May 25, 2022, to which this application claims priority, is hereby incorporated herein by reference, in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A power electronics arrangement, comprising:

an electrical conduction section; and a switching device which, in operation, switches the electrical conduction section, wherein the switching device includes multiple parallel connected semiconductor switches which, in operation, are triggered in common by a control unit through a plurality of lead wires and are switched across respective ones of the lead wires upon reaching a switching state of charge, wherein each of the lead wires has a same electrical resistance, and wherein each of the lead wires has a different length.

2. The power electronics arrangement according to claim 1, wherein the semiconductor switches are Metal Oxide Semiconductor Field Effect Transistors (MOSFETs).

3. The power electronics arrangement according to claim 1, wherein the semiconductor switches are Silicon Carbide (SiC) Metal Oxide Semiconductor Field Effect Transistors (MOSFETs).

4. The power electronics arrangement according to claim 1, wherein the power electronics arrangement includes three to ten of the semiconductor switches.

5. The power electronics arrangement according to claim 1, wherein the lead wires include bond wires or conductor tracks on a circuit board carrying the semiconductor switches.

6. The power electronics arrangement according to claim 1, wherein the lead wires differ in at least one adaptation property that equalizes resistance differences due to the lead wires having different lengths.

7. The power electronics arrangement according to claim 6, wherein the adaptation property is a thickness of each of the lead wires.

8. The power electronics arrangement according to claim 6, wherein the adaptation property is a material from which each of the lead wires is made or a lateral extension of each of the lead wires.

9. The power electronics arrangement according to claim 8, wherein the materials from which the lead wires are made differ in purity, electrical conductance, or composition.

10. The power electronics arrangement according to claim 1, wherein the power electronics arrangement is included in a power electronics device.

11. The power electronics arrangement according to claim 10, wherein the power electronics device is a pulse inverter converter device, a Direct Current (DC) voltage converter device, or a charging device that charges a motor vehicle battery.

12. The power electronics arrangement according to claim 1, wherein the power electronics arrangement is included in a motor vehicle.

13. A method of producing a power electronics arrangement, the method comprising:

providing an electrical conduction section; and providing a switching device that switches the electrical conduction section, wherein the switching device includes multiple parallel connected semiconductor switches which are triggered in common by a control unit through a plurality of lead wires and are switched across respective ones of the lead wires upon reaching a switching state of charge, wherein each of the lead wires has a different length, and wherein each of the lead wires has a same electrical resistance.

* * * * *